United States Patent
He

(10) Patent No.: US 9,670,588 B2
(45) Date of Patent: Jun. 6, 2017

(54) ANISOTROPIC HIGH RESISTANCE IONIC CURRENT SOURCE (AHRICS)

(71) Applicant: Lam Research Corporation, Fremont, CA (US)

(72) Inventor: Zhian He, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 380 days.

(21) Appl. No.: 14/251,108

(22) Filed: Apr. 11, 2014

(65) Prior Publication Data

US 2014/0326608 A1     Nov. 6, 2014

Related U.S. Application Data

(60) Provisional application No. 61/818,353, filed on May 1, 2013.

(51) Int. Cl.
| | | |
|---|---|---|
| *C25D 17/00* | (2006.01) | |
| *C25D 7/12* | (2006.01) | |
| *C25D 17/10* | (2006.01) | |

(52) U.S. Cl.
CPC ......... *C25D 17/001* (2013.01); *C25D 17/007* (2013.01); *C25D 17/008* (2013.01); *C25D 7/123* (2013.01); *C25D 17/10* (2013.01)

(58) Field of Classification Search
None
See application file for complete search history.

(56) References Cited

U.S. PATENT DOCUMENTS

| | | |
|---|---|---|
| 3,652,442 A | 3/1972 | Powers et al. |
| 3,706,651 A | 12/1972 | Leland |
| 3,862,891 A | 1/1975 | Smith |
| 4,033,833 A | 7/1977 | Bestel et al. |

(Continued)

FOREIGN PATENT DOCUMENTS

| | | |
|---|---|---|
| CN | 1624207 A | 6/2005 |
| CN | 1705774 A | 12/2005 |

(Continued)

OTHER PUBLICATIONS

U.S. Appl. No. 13/907,265, filed May 31, 2013, entitled Method and Apparatus for Electroplating.

(Continued)

*Primary Examiner* — Harry D Wilkins, III
(74) *Attorney, Agent, or Firm* — Weaver Austin Villeneuve & Sampson LLP

(57) ABSTRACT

An electroplating apparatus that promotes uniform electroplating on the substrates having thin seed layers includes a convex anisotropic high resistance ionic current source (AHRICS), such as an electrolyte-permeable resistive domed plate. The AHRICS is positioned in close proximity of the substrate, so that a distance from the central portion of the AHRICS to the substrate is smaller than the distance from the edge portion of the AHRICS to the substrate. The apparatus further includes a plating chamber configured to hold the electrolyte and an anode. The apparatus further includes a substrate holder configured to hold the substrate. In some embodiments, the apparatus further includes a secondary (thief) cathode configured to divert ionic current from the near-edge region of the substrate.

18 Claims, 10 Drawing Sheets

(56) References Cited

U.S. PATENT DOCUMENTS

| | | |
|---|---|---|
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,389,297 A | 6/1983 | Korach |
| 4,409,339 A | 10/1983 | Matsuda et al. |
| 4,469,564 A | 9/1984 | Okinaka et al. |
| 4,545,877 A | 10/1985 | Hillis |
| 4,604,177 A | 8/1986 | Sivilotti |
| 4,604,178 A | 8/1986 | Flegener et al. |
| 4,605,482 A | 8/1986 | Shiragami et al. |
| 4,696,729 A | 9/1987 | Santini |
| 4,828,654 A | 5/1989 | Reed |
| 4,906,346 A | 3/1990 | Hadersbeck et al. |
| 4,931,149 A | 6/1990 | Stierman et al. |
| 4,933,061 A | 6/1990 | Kulkarni et al. |
| 5,000,827 A * | 3/1991 | Schuster .............. C25D 5/02 205/118 |
| 5,035,784 A | 7/1991 | Anderson et al. |
| 5,039,381 A | 8/1991 | Mullarkey |
| 5,078,852 A | 1/1992 | Yee et al. |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,332,487 A | 7/1994 | Young et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,452,053 A | 9/1995 | Nozue |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,660,699 A | 8/1997 | Saito et al. |
| 5,723,028 A | 3/1998 | Poris |
| 5,744,019 A | 4/1998 | Ang |
| 5,935,402 A | 8/1999 | Fanti |
| 6,004,440 A | 12/1999 | Hanson et al. |
| 6,027,631 A | 2/2000 | Broadbent |
| 6,080,291 A | 6/2000 | Woodruff et al. |
| 6,106,687 A | 8/2000 | Edelstein |
| 6,126,798 A | 10/2000 | Reid et al. |
| 6,132,587 A | 10/2000 | Jorne et al. |
| 6,132,805 A | 10/2000 | Moslehi |
| 6,156,167 A | 12/2000 | Patton et al. |
| 6,179,983 B1 | 1/2001 | Reid et al. |
| 6,193,860 B1 | 2/2001 | Weling |
| 6,228,231 B1 | 5/2001 | Uzoh |
| 6,251,255 B1 | 6/2001 | Copping et al. |
| 6,261,433 B1 | 7/2001 | Landau |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,398,926 B1 | 6/2002 | Mahneke |
| 6,402,923 B1 | 6/2002 | Mayer et al. |
| 6,497,801 B1 | 12/2002 | Woodruff et al. |
| 6,521,102 B1 | 2/2003 | Dordi |
| 6,527,920 B1 | 3/2003 | Mayer et al. |
| 6,551,483 B1 | 4/2003 | Mayer et al. |
| 6,569,299 B1 | 5/2003 | Reid et al. |
| 6,627,051 B2 | 9/2003 | Berner et al. |
| 6,632,335 B2 | 10/2003 | Kunisawa et al. |
| 6,692,588 B1 | 2/2004 | Uzoh et al. |
| 6,755,954 B2 | 6/2004 | Mayer et al. |
| 6,773,571 B1 | 8/2004 | Mayer et al. |
| 6,800,187 B1 | 10/2004 | Reid et al. |
| 6,821,407 B1 | 11/2004 | Reid et al. |
| 6,890,416 B1 | 5/2005 | Mayer et al. |
| 6,919,010 B1 | 7/2005 | Mayer et al. |
| 6,921,468 B2 | 7/2005 | Graham et al. |
| 6,964,792 B1 | 11/2005 | Mayer et al. |
| 7,070,686 B2 | 7/2006 | Contolini et al. |
| 7,169,705 B2 | 1/2007 | Ide et al. |
| D544,452 S | 6/2007 | Nakamura et al. |
| D548,705 S | 8/2007 | Hayashi |
| D552,565 S | 10/2007 | Nakamura et al. |
| D553,104 S | 10/2007 | Oohashi et al. |
| D587,222 S | 2/2009 | Sasaki et al. |
| 7,622,024 B1 | 11/2009 | Mayer et al. |
| 7,641,776 B2 | 1/2010 | Nagar et al. |
| D609,652 S | 2/2010 | Nagasaka et al. |
| D609,655 S | 2/2010 | Sugimoto |
| 7,670,465 B2 | 3/2010 | Yang et al. |
| D614,593 S | 4/2010 | Lee et al. |
| 7,837,841 B2 | 11/2010 | Chen et al. |
| 7,854,828 B2 | 12/2010 | Reid et al. |
| 7,935,240 B2 | 5/2011 | Singh et al. |
| 7,967,969 B2 | 6/2011 | Mayer et al. |
| D648,289 S | 11/2011 | Mayer et al. |
| 8,308,931 B2 | 11/2012 | Reid et al. |
| 8,475,636 B2 | 7/2013 | Mayer et al. |
| 8,475,644 B2 | 7/2013 | Mayer et al. |
| 8,603,305 B2 | 12/2013 | Rash et al. |
| 8,623,193 B1 | 1/2014 | Mayer et al. |
| 8,795,480 B2 | 8/2014 | Mayer et al. |
| 9,309,604 B2 | 4/2016 | Mayer et al. |
| 2001/0050233 A1 * | 12/2001 | Uzoh ...................... C25D 5/08 205/96 |
| 2002/0017456 A1 | 2/2002 | Graham et al. |
| 2002/0020627 A1 | 2/2002 | Kunisawa et al. |
| 2002/0119671 A1 | 8/2002 | Lee |
| 2002/0125141 A1 | 9/2002 | Wilson et al. |
| 2003/0029527 A1 | 2/2003 | Yajima et al. |
| 2003/0038035 A1 | 2/2003 | Wilson et al. |
| 2003/0079995 A1 | 5/2003 | Contolini et al. |
| 2003/0102210 A1 | 6/2003 | Woodruff et al. |
| 2003/0201166 A1 | 10/2003 | Zheng et al. |
| 2004/0149584 A1 | 8/2004 | Nagai et al. |
| 2005/0145499 A1 | 7/2005 | Kovarsky et al. |
| 2006/0000704 A1 | 1/2006 | Sato et al. |
| 2006/0243598 A1 | 11/2006 | Singh et al. |
| 2007/0029193 A1 | 2/2007 | Brcka |
| 2007/0068819 A1 | 3/2007 | Singh et al. |
| 2007/0238265 A1 | 10/2007 | Kurashina et al. |
| 2010/0032304 A1 | 2/2010 | Mayer et al. |
| 2010/0032310 A1 | 2/2010 | Reid et al. |
| 2010/0044236 A1 | 2/2010 | Mayer et al. |
| 2010/0116672 A1 | 5/2010 | Mayer et al. |
| 2011/0031112 A1 | 2/2011 | Birang et al. |
| 2012/0000786 A1 | 1/2012 | Mayer et al. |
| 2012/0261254 A1 | 10/2012 | Reid et al. |
| 2013/0137242 A1 | 5/2013 | He et al. |
| 2013/0313123 A1 | 11/2013 | Abraham et al. |
| 2013/0327650 A1 | 12/2013 | Mayer et al. |
| 2014/0124361 A1 | 5/2014 | Reid et al. |
| 2016/0222535 A1 * | 8/2016 | Zhou ...................... C25D 5/08 |
| 2016/0273119 A1 | 9/2016 | He et al. |
| 2016/0333495 A1 | 11/2016 | Kagajwala et al. |

FOREIGN PATENT DOCUMENTS

| | | |
|---|---|---|
| CN | 101056718 A | 10/2007 |
| CN | 100487855 C | 5/2009 |
| CN | 101736376 A | 6/2010 |
| CN | 101925981 A | 12/2010 |
| CN | 102296344 A | 12/2011 |
| CN | 301883011 S | 4/2012 |
| CN | 102459717 A | 5/2012 |
| CN | 102560612 A | 7/2012 |
| EP | 0037325 | 3/1981 |
| JP | 59-162298 | 9/1984 |
| JP | 09-53197 | 2/1997 |
| JP | 2001-316887 | 11/2001 |
| JP | 2003-268591 | 9/2003 |
| KR | 10-0707121 | 4/2007 |
| KR | 0657600 | 8/2012 |
| TW | 223678 | 11/2004 |
| TW | D148167 | 7/2012 |

(56) References Cited

FOREIGN PATENT DOCUMENTS

| WO | WO99/41434 | 8/1999 |
|---|---|---|
| WO | WO2005/043593 | 5/2005 |
| WO | WO2010/144330 | 12/2010 |

OTHER PUBLICATIONS

U.S. Appl. No. 14/153,582, filed Jan. 13, 2014, entitled Method and Apparatus for Filling Interconnect Structures.
US Office Action dated Oct. 26, 2007 issued in U.S. Appl. No. 11/040,359.
US Final Office Action dated Jul. 25, 2008 issued in U.S. Appl. No. 11/040,359.
US Office Action dated Jan. 8, 2009 issued in U.S. Appl. No. 11/040,359.
US Notice of Allowance dated Jul. 20, 2009 issued in U.S. Appl. No. 11/040,359.
US Office Action dated Oct. 6, 2010 issued in U.S. Appl. No. 12/578,310.
US Notice of Allowance dated Mar. 4, 2011 issued in U.S. Appl. No. 12/578,310.
US Office Action dated Oct. 5, 2012 issued in U.S. Appl. No. 13/110,759.
US Final Office Action dated Mar. 29, 2013 issued in U.S. Appl. No. 13/110,759.
US Notice of Allowance dated Sep. 11, 2013 issued in U.S. Appl. No. 13/110,759.
US Office Action dated Sep. 19, 2011 issued in U.S. Appl. No. 12/291,356.
US Final Office Action dated Feb. 27, 2012 issued in U.S. Appl. No. 12/291,356.
US Notice of Allowance dated Jul. 27, 2012 issued in U.S. Appl. No. 12/291,356.
US Office Action dated Jun. 24, 2011 issued in U.S. Appl. No. 12/481,503.
US Final Office Action dated Mar. 1, 2012 issued in U.S. Appl. No. 12/481,503.
US Office Action dated Jul. 9, 2012 issued in U.S. Appl. No. 12/481,503.
US Final Office Action dated Dec. 19, 2012 issued in U.S. Appl. No. 12/481,503.
US Notice of Allowance dated Mar. 1, 2013 issued in U.S. Appl. No. 12/481,503.
US Office Action dated Jun. 24, 2011 issued in U.S. Appl. No. 12/606,030.
US Final Office Action dated Mar. 1, 2012 issued in U.S. Appl. No. 12/606,030.
US Office Action dated Jul. 13, 2012 issued in U.S. Appl. No. 12/606,030.
US Final Office Action dated Dec. 17, 2012 issued in U.S. Appl. No. 12/606,030.
US Notice of Allowance dated Mar. 1, 2013 issued in U.S. Appl. No. 12/606,030.
US Office Action, dated May 23, 2013, issued in U.S. Appl. No. 13/108,881.
US Final Office Action, dated Oct. 25, 2013, issued in U.S. Appl. No. 13/108,881.
US Notice of Allowance dated Aug. 10, 2011 issued in Design U.S. Appl. No. 29/377,521.
Chinese First Office Action dated May 15, 2013 issued in Application No. 200910209697.2.
Chinese Second Office Action dated Dec. 13, 2013 issued in Application No. 200910209697.2.
PCT International Search Report and Written Opinion dated Jan. 12, 2011 issued in Application No. PCT/US2010/037520.
PCT International Preliminary Report on Patentability and Written Opinion dated Dec. 22, 2011 issued in Application No. PCT/US2010/037520.
Chinese First Office Action dated Nov. 6, 2013 issued in CN 201080032109.3.
Chinese Office Action dated Jul. 19, 2011 issued in Application No. 201130081716.6.
TW Office Action dated Nov. 28, 2011 issued in Application No. 100301923.
KR Office Action dated Apr. 20, 2012 issued in Application No. 2011-0012881.
Fang et al. (2004) "Uniform Copper Electroplating on Resistive Substrates," *Abs. 167, 205th Meeting, The Electrochemical Society, Inc.*, 1 page.
Malmstadt et al. (1994) "Microcomputers and Electronic Instrumentation: Making the Right Connections," *American Chemical Society*, p. 255 (3pp).
"Release of Sabre™ electrofill tool with HRVA by Novellus Systems, Inc." no earlier than Aug. 2005. (3 pages).
U.S. Appl. No. 14/662,823, filed Mar. 19, 2015, entitled "Control of Electrolyte Flow Dynamics for Uniform Electroplating".
U.S. Appl. No. 14/712,553, filed May 14, 2015, entitled "Apparatus and Method for Electodeposition of Metals With the Use of an Ionically Resistive Ionically Permeable Element Having Spatially Tailored Resistivity".
US Office Action dated Jun. 28, 2012 issued in U.S. Appl. No. 12/606,030.
US Office Action dated Jul. 29, 2015 issued in U.S. Appl. No. 13/907,265.
US Notice of Allowance dated Dec. 30, 2015 issued in U.S. Appl. No. 13/907,265.
US Office Action, dated Oct. 22, 2015, issued in U.S. Appl. No. 14/153,582.
US Office Action, dated May 9, 2016, issued in U.S. Appl. No. 14/153,582.
Chinese First Office Action dated Jan. 29, 2016 issued in Application No. CN 201410183216.6.
Chinese Second Office Action dated Jun. 10, 2014 issued in Application No. CN 201080032109.3.
Taiwan Office Action dated Jul. 31, 2014 issued in Application No. TW 099118603.
Chinese First Office Action dated Jul. 20, 2015 issued in Application No. CN 201210108100.7.
Chinese Second Office Action dated Feb. 25, 2016 issued in Application No. CN 201210108100.7.
Taiwan Office Action dated Jan. 20, 2016 issued in Application No. TW 101113319.
Chinese Second Office Action dated Sep. 27, 2016 issued in Application No. CN 201410183216.6.
Korean Office Action dated Jun. 21, 2016 issued in Application No. KR 10-2012-7000614.
Chinese Third Office Action dated Mar. 28, 2017 in Application No. CN 201410183216.6.

* cited by examiner

ANISOTROPIC HIGH RESISTANCE IONIC CURRENT SOURCE (AHRICS)

CROSS-REFERENCE TO RELATED APPLICATIONS

This application claims priority to U.S. Provisional Application Ser. No. 61/818,353 titled ANISOTROPIC HIGH RESISTANCE IONIC CURRENT SOURCE filed May 1, 2013 naming He as the inventor, which is herein incorporated by reference in its entirety and for all purposes.

FIELD OF THE INVENTION

The present invention relates generally to a method and apparatus for electroplating a layer on a substrate, such as a semiconductor wafer. It is particularly useful for electroplating copper in Damascene and dual Damascene integrated circuit fabrication methods.

BACKGROUND OF THE INVENTION

The transition from aluminum to copper in integrated circuit (IC) fabrication required a change in process "architecture" (to damascene and dual-damascene) as well as a whole new set of process technologies. One process step used in producing copper damascene circuits is the formation of a "seed-" or "strike-" layer, which is then used as a base layer onto which copper is electroplated ("electrofill"). The seed layer carries the electrical plating current from the edge region of the wafer (where electrical contact is made) to all trench and via structures located across the wafer surface. The seed film is typically a thin conductive copper layer or a layer of other metal. It is separated from the insulating silicon dioxide or other dielectric by a barrier layer.

As the semiconductor industry advances, future technology nodes will require extremely thin and resistive seed layers for electrochemical fill. It becomes a very challenging problem to achieve uniform electroplating thickness/current across the wafer with such resistive seeds.

When a wafer substrate is being plated, direct electrical contact to the wafer is made to the conductive seed layer in the edge region of the wafer substrate, and there is no direct contact made to the center region of the wafer substrate. The wafer acts as a cathode, at which the metal ions from the electrolyte are being reduced to form the metal layer. When very resistive seed layers are used, the potential at the edge of the seed layer at the point of electrical contact is much greater than in the center region of the seed layer further away from the electrical contact. Without compensation, this leads to significantly thicker plating at the edge of the wafer than at the center region of the wafer. The center to edge variation in potential is usually termed as the "terminal effect". With the advance of device technology, seed layer thicknesses decrease (thus seed layers becoming more resistive), and wafer diameters sometimes increase. As a result, the difference in potential between the center and edge (due to the terminal effect) becomes more pronounced. Methods and apparatus for compensating the terminal effect, and for providing uniform center to edge plating thicknesses are needed.

SUMMARY

Certain aspects of this disclosure pertain to specially shaped high resistance plates that provide anisotropic ionic conductance and current re-distribution effects to modulate the current density profile on the working cathode substrate (wafers in this application). This concept provides an efficient way to achieve uniform plating on wafer substrates with a wide range of seed layer sheet resistances (for example, from 50 ohm/sq to 0.01 ohm/sq).

In one aspect an electroplating apparatus is provided. The electroplating apparatus includes: (a) a plating chamber configured to contain an electrolyte and an anode while electroplating metal onto a substantially planar substrate (e.g., onto a semiconductor wafer); (b) a substrate holder configured to hold the substantially planar substrate such that a plating face of the substrate is separated from the anode during electroplating; and (c) an anisotropic high resistance ionic current source (AHRICS), e.g., a high resistance anisotropic plate, having an edge region and a central region and comprising a substrate-facing surface having a shape that provides a greater distance to the substrate from the edge region than from the central region during electroplating. The AHRICS is configured in many embodiments to correct ionic current such that the center of the substrate receives substantially the same amount of plating as the edge of the substrate.

In some embodiments the AHRICS is resistive dome-shaped electrolyte-permeable plate that has a resistivity that is greater than the resistivity of the electrolyte, when in use.

In some embodiments the AHRICS comprises an ionically resistive material with a plurality of channels made through the ionically resistive material (e.g., drilled holes), where the channels allow for transport of the electrolyte through the AHRICS. In some embodiments the channels are not fluidically connected within the body of the AHRICS, i.e., are non-communicating channels. In other embodiments, the AHRICS may include a 3-D network of pores.

The thickness of the AHRICS is, preferably, substantially the same in the central region as in the edge region. In one implementation the substrate-facing surface of the AHRICS follows a parabolic function from the edge region to the central region, when viewed in cross-section. In another implementation the substrate-facing surface of the AHRICS follows a linear function from the edge region to the central region, when viewed in cross-section. In yet another implementation the substrate-facing surface of the AHRICS follows a combination of linear and parabolic functions from the edge region to the central region, when viewed in cross-section.

In some embodiments, the "doming" of the AHRICS, defined as the distance in z-direction between the center of the AHRICS and the edge of the AHRICS is between about 4 and 15 mm, as measured on the substrate-facing surface of the AHRICS. In some embodiments the AHRICS is positioned such that the distance between the substrate and the substrate-facing surface of the AHRICS is between about 2-15 mm in the central region, and the distance between the substrate and the substrate-facing surface of the AHRICS is between about 6-20 mm in the edge region.

In some embodiments the AHRICS is made of an ionically resistive material such as polyethylene, polypropylene, polyvinylidene difluoride (PVDF), polytetrafluoroethylene, polysulphone, polyvinyl chloride (PVC), polycarbonate, or combinations thereof and has thousands of through-holes that allow the electrolyte to pass through the AHRICS. In some embodiments the AHRICS includes between about 1000-25,000 non-communicating channels made within the ionically resistive material. The diameter of each channel is, preferably, not greater than the closest distance between the substrate and the AHRICS.

In some embodiments additional ionically resistive ionically permeable plates (e.g., one or more additional plates) are stacked with the AHRICS. Preferably, the stacked plates are separated from each other.

In some embodiments the apparatus further includes a secondary cathode configured to divert ionic current from an edge region of the substrate. In some embodiments the apparatus further includes a shield configured to block ionic current at the edge region of the substrate.

In another aspect, a method of electroplating on a substrate is provided. The method includes: (a) providing the substrate to a plating chamber configured to contain an electrolyte and an anode while electroplating metal onto the substrate, wherein the plating chamber includes: (i) a substrate holder holding the substrate such that a plating face of the substrate is separated from the anode during electroplating, and (ii) an AHRICS having an edge region and a central region and comprising a substrate-facing surface having a shape that provides a greater distance to the substrate from the edge region than from the central region during electroplating; and (b) electroplating a metal onto the substrate plating face while rotating the substrate and while providing the electrolyte in the electroplating cell in the direction of the substrate plating face through the channels of the flow shaping element.

In yet another aspect, an apparatus that is configured to redistribute ionic current towards the edges of the substrate and to deposit edge-thick layers, is provided. For this application, the apparatus includes (a) a plating chamber configured to contain an electrolyte and an anode while electroplating metal onto a substantially planar substrate; (b) a substrate holder configured to hold the substantially planar substrate such that a plating face of the substrate is separated from the anode during electroplating; and (c) an anisotropic high resistance ionic current source (AHRICS) having an edge region and a central region and comprising a substrate-facing surface having a shape that provides a smaller distance to the substrate from the edge region than from the central region during electroplating. In this embodiment the AHRICS is configured to redistribute ionic current such that the edge of the substrate receives more plating current than the center of the substrate.

The apparatuses provided herein can be equipped with a controller having logic or program instructions for performing the electroplating methods provided herein. In one aspect, a machine-readable medium is provided, wherein the machine-readable medium includes a code for performing any of the methods provided herein.

The apparatuses and methods provided herein can be integrated with the photolithographic process flow. In some embodiments, a system is provided which includes an electroplating apparatus described herein and a stepper. In some embodiments the methods described herein further include applying photoresist to the substrate; exposing the photoresist to light; patterning the resist and transferring the pattern to the workpiece; and selectively removing the photoresist from the work piece.

DETAILED DESCRIPTION

Embodiments of AHRICS provided herein can be used to control uniformity of electroplating on a variety of substrates, including semiconductor wafers having Damascene features, such as vias and trenches, wafers undergoing through silicon via (TSV) processing and wafers undergoing wafer level packaging (WLP) processing.

In some embodiments, a convex AHRICS is used to promote center-to-edge uniform electroplating. The convex AHRICS is positioned within the electroplating apparatus such that the distance from its central portion to the wafer substrate is smaller than the distance from its edge portion to the wafer substrate. The central portion includes the center of the AHRICS plate and adjacent region (e.g., within a distance from the center of less than 10% of AHRICS radius), while the edge region includes the edge of the AHRICS and the adjacent region (e.g., within a distance from the edge of less than 10% of the AHRICS radius). The convex AHRICS is capable of redistributing ionic current towards the central portion of the wafer substrate, and therefore can reduce the terminal effect.

It was demonstrated that a convex AHRICS promotes uniform plating better than a flat resistive plate having the same resistivity. Therefore such AHRICS plates are highly desirable because relatively less resistive plates can be used to achieve the same reduction in terminal effect, thereby reducing demands on power and power supplies that are imposed by the presence of highly resistive plates in the plating chamber.

In addition, a convex AHRICS is capable of promoting uniformity efficiently over a large range of seed layer sheet resistances and therefore the electroplating system with a convex AHRICS may require little or no dynamic adjustment during the course of electroplating, associated with decrease in sheet resistance of the plated layer.

Figure 1A:
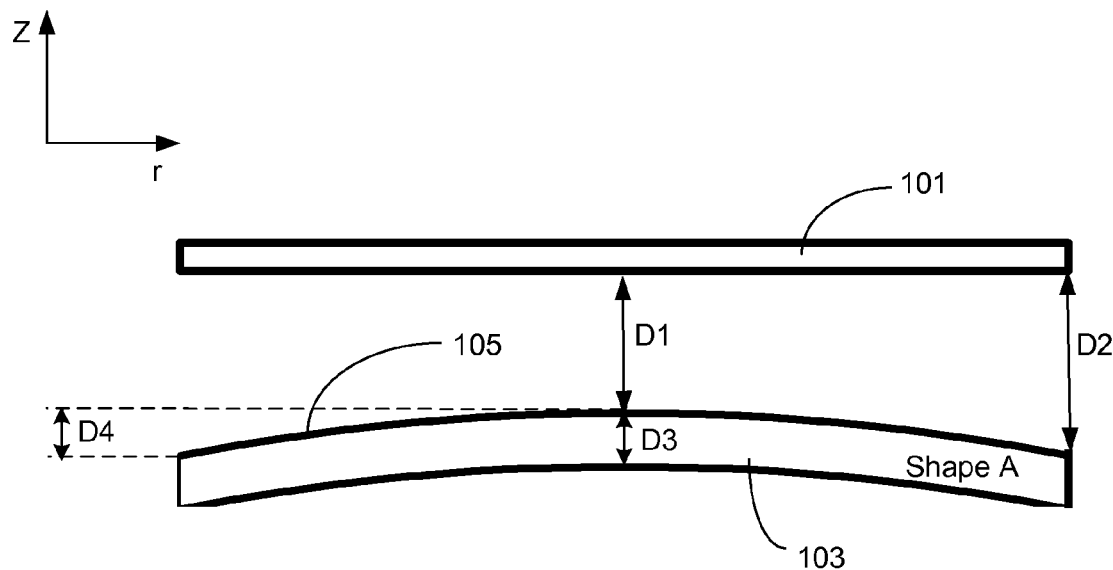
FIG. 1A provides a schematic cross-sectional view of a convex AHRICS in relation to the wafer substrate, in accordance with an embodiment provided herein.

An example of a convex AHRICS positioned such that it is configured to re-distribute ionic current such that the edge and the center of the substrate receive substantially the same amount of plating, is illustrated in FIG. 1A, where a schematic cross-sectional view of the wafer 101 and of the AHRICS 103 is shown. The AHRICS is located directly below the wafer on the z axis and is substantially co-extensive with the wafer in the x-direction. The AHRICS has a convex substrate-facing surface 105 and is positioned such that the distance D1 from the central region of the surface 105 to the plating surface of the substantially planar wafer is smaller than the distance D2 from the edge region of the surface 105 to the plating surface of the wafer. The thickness of the AHRICS D3 is the same in the central region as in the edge region. The "doming" of the AHRICS is defined by the difference D4 between the positions of the center of the substrate-facing surface and the edge of the substrate-facing surface on the z-axis. In some embodiments the doming distance D4 is between about 4-15 mm. In some embodiments the distance D2 at the edge is between about 6 and 20 mm, and the smaller distance D1 at the center is between about 2 and 15 mm.

The shape of the AHRICS shown in FIG. 1A is referred to as Shape A. Shape A is characterized by the AHRICS positioned in a convex orientation having the substrate-facing surface that follows a parabolic function (quadratic polynomial) from the edge region to the center region when viewed in cross-section, and is sometimes referred to as a parabolic AHRICS. Such surfaces are preferred in many embodiments as they can more effectively correct the terminal effect than surfaces following a linear function. In general, AHRICSs with a variety of shapes of substrate-facing surfaces can be used.

Figure 1B:
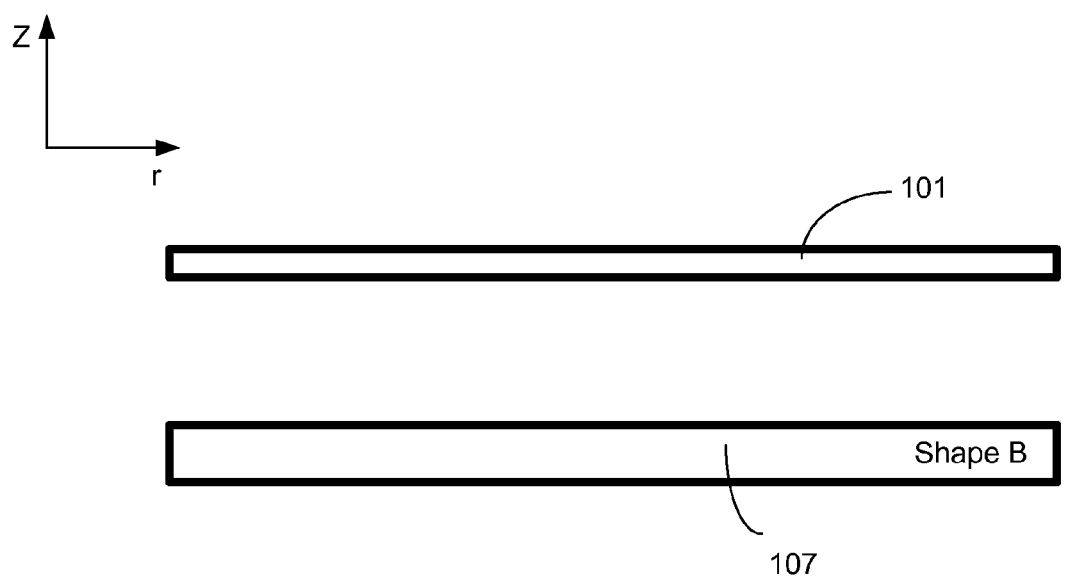
FIG. 1B provides a schematic cross-sectional view of a conventional flat resistive plate and the substrate.
Figure 1C:
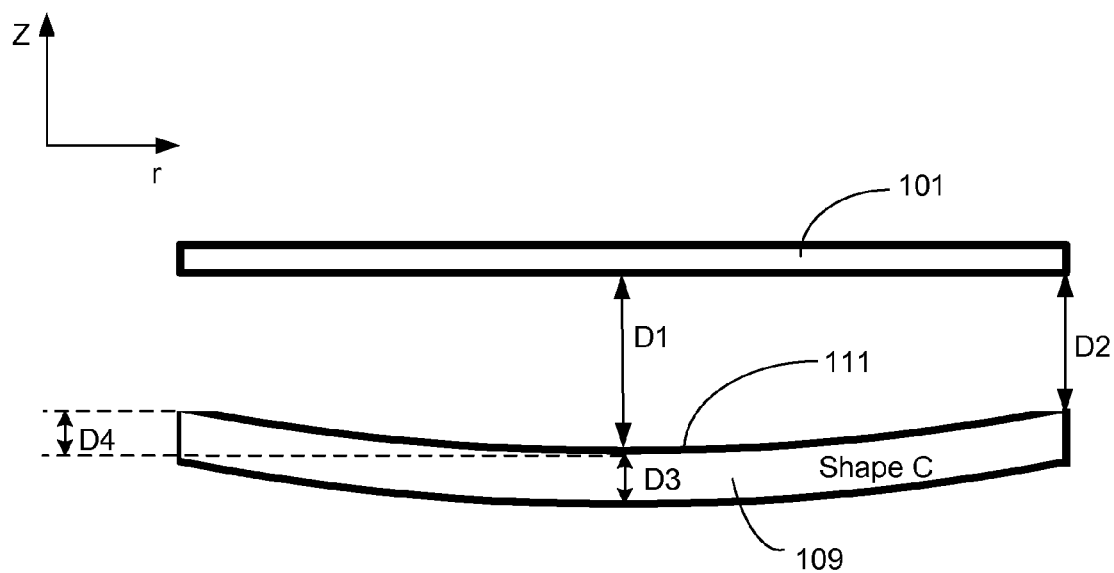
FIG. 1C provides a schematic cross-sectional view of a concave AHRICS in relation to the wafer substrate, in accordance with an embodiment, in which the AHRICS is configured for edge-thick plating.
Figure 1D:
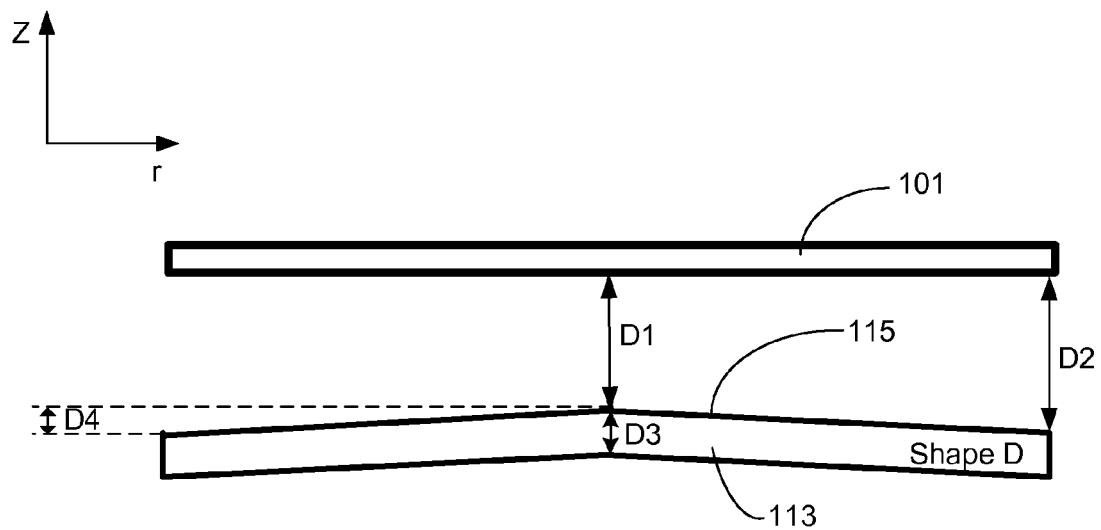
FIG. 1D provides a schematic cross-sectional view of a convex AHRICS in relation to the wafer substrate, in accordance with an embodiment provided herein.

In some embodiments, such as in the embodiment shown in FIG. 1D, the AHRICS 113 has a substrate-facing surface 115, where the substrate facing surface follows a linear function from central portion to the edge portion, as viewed in cross-section. This shape and orientation of AHRICS will be referred to as Shape D, or a linear AHRICS. In other embodiments (not shown) the substrate-facing surface as viewed in cross section may follow a combination of linear and parabolic functions. For example a parabolic function can be followed in the central portion of the AHRICS and a linear function can be followed at the edge portion of the AHRICS. In another example, the substrate-facing surface in cross-section follows a parabolic function at the edge portion of the substrate, and then follows linear function elsewhere (e.g., at the central portion of the substrate-facing surface). In some embodiments, the substrate-facing surface of the AHRICS follows any desired polynomial function (not necessarily parabolic) which can be used alone or in combination with other shapes.

The AHRICSs will be described in comparison with a flat high resistance current source that has a planar substrate-facing surface, and that has been conventionally used to mitigate the terminal effect. Such flat plate 107 is shown in FIG. 1B, and is referred to as Shape B or simply flat plate. While shape B can mitigate the terminal effect and improve center-to edge uniformity, the AHRICS is more preferable than a planar plate because the AHRICS can maintain uniform plating on seed layers having varying sheet resistance, without the need of dynamic adjustment of the AHRICS during plating (although AHRICS in some embodiments can be used in combination with dynamic adjustment). This is important, because as the electroplating proceeds, the initially highly resistive seed layer becomes less resistive and the terminal effect is diminished. The use of AHRICS can improve uniformity during electroplating not only in the beginning of electroplating but also after the resistivity of the seed layer diminishes in the course of electroplating. In addition, a convex AHRICS can improve uniformity better than a flat plate of the same resistance.

Wafer substrates with different seed layer sheet resistances are expected to exhibit different terminal effects due to the difference in the electrical path resistance from the center of the wafer to the edge of the wafer where electrical contact is made. A flat plate (shape B) typically shows different current density profile on cathode (wafer) with different initial sheet resistance. For the dome shaped convex AHRICS plate of Shape A, however, with a properly selected plate thickness, resistance, amount of doming, a single domed AHRICS plate can cover a large range of conducting seed layers, with sheet resistance ranging from 50 ohm/sq to 0.01 ohm/sq. The AHRICS-containing electroplating system generates substantially flat current density profiles for wafer substrates with a wide range of sheet resistances. The "self-correction" or "self-tuning" capability of the domed AHRICS plate can significantly reduce the need for other profile control mechanisms in a plating system, and also reduce the need for profile tuning for each cathode (wafer) type.

In a separate aspect, an AHRICS, positioned such that it has a concave shape, as shown in FIG. 1C is provided. This embodiment can be used for those applications where ionic current redistribution towards wafer edge is desirable. The use of such AHRICS can result in edge-thick electrodeposition, which may be desirable in some applications, such as to facilitate chemical mechanical polishing (CMP) removal of excess electrodeposited metal. In this embodiment, the concave AHRICS 109 having Shape C is positioned directly below the wafer substrate 101, such that the distance D1 from the central portion of the substrate-facing surface 111 to the plating face of the substrate 101 is greater than the distance D2 from the edge portion of the substrate-facing surface 111 to the plating face of the substrate 101.

The dimensions and positioning of the AHRICS, such as the convex AHRICSs shown in FIGS. 1A and 1D, and of the concave AHRICS shown in FIG. 1C are important parameters in center-to-edge uniformity control.

In certain embodiments, the AHRICS plate approximates a nearly constant current source in the proximity of the plating substrate (cathode) and, as such, may be referred to as a virtual anode in some contexts. Normally, the AHRICS plate is placed in close proximity with respect to the wafer. In contrast, an anode in the same close-proximity to the substrate would be significantly less apt to supply a nearly constant current to the wafer, but would merely support a constant potential at the anode metal surface, thereby allowing the current to be greatest where the net resistance from the anode plane to the terminus (e.g., to peripheral contact points on the wafer) is smaller. While the AHRICS plate may be viewable as a "virtual current source", i.e. it is a surface from which the current is emanating, and therefore can be considered a "virtual anode" because it is a source of anodic current flow, it is the relatively high ionic-resistance of the element (with respect to the electrolyte) that leads to further advantageous, electroplating uniformity when compared to having a metallic anode located at the same physical location.

In certain embodiments, the AHRICS plate contains through-holes that are spatially and ionically isolated from each other and do not form interconnecting channels within the body of the AHRICS plate. Such through-holes are often referred to as non-communicating through-holes or channels. They typically extend in one dimension, often, but not necessarily, normal to the plated surface of the wafer (in some embodiments the non-communicating holes are at an angle with respect to the wafer). Often the through-holes are parallel to one another. These through-holes are distinct from 3-D porous networks, where the channels extend in three dimensions and form interconnecting pore structures. It should be understood that the embodiments disclosed herein do not foreclose the use of AHRICSs with 3-D networks of pores.

An example of an AHRICS plate is a dome, such as Shape A, made of an ionically resistive material, such as polyethylene, polypropylene, polyvinylidene difluoride (PVDF), polytetrafluoroethylene, polysulphone, polyvinyl chloride (PVC), polycarbonate, and the like, having thousands (e.g., between about 1,000-25,000) non-communicating through-holes. The dome, in many embodiments, is substantially coextensive with the wafer (e.g., has a diameter of about 300 mm or 450 mm when used with a 300 mm or a 450 mm wafer respectively) and resides in close proximity of the wafer, e.g., just below the wafer in a wafer-facing-down electroplating apparatus. In certain embodiments, the plated surface of the wafer resides within about 10 mm, more preferably within about 5 mm of the closest AHRICS surface. This distance refers to distance D1 shown in FIG. 1A and FIG. 1D, and to distance D2 shown in FIG. 1C.

Another feature of the AHRICS plate is the diameter or principal dimension of the through-holes and its relation to the distance between the AHRICS and the substrate. In certain embodiments, the diameter of each through-hole (or of majority of through-holes) is no more than the distance from the plated wafer surface to the closest surface of the AHRICS. Thus, in such embodiments, the diameter or principal dimension of the through holes should not exceed about 5 mm, when the AHRICS is placed within about 5 mm of the plated wafer surface.

The presence of a resistive but ionically permeable element close to the wafer substantially reduces the terminal effect and improves radial plating uniformity. It may also simultaneously provides the ability to have a substantially spatially-uniform impinging flow of electrolyte directed upwards at the wafer surface by acting as a flow diffusing manifold plate. Because non-communicating through-holes do not allow for lateral movement of ionic current or fluid motion within the AHRICS plate (in the embodiment employing non-communicating holes), the center-to-edge current and flow movements are blocked within the AHRICS in this embodiment, leading to further improvement in radial plating uniformity.

It is noted that in some embodiments, the AHRICS plate can be used as an electrolyte flow shaping element, or turboplate. In TSV (through silicon via) and WLP (wafer level packaging) electroplating, where metal is being deposited at very high rates, uniform distribution of electrolyte flow is very important. Therefore the AHRICS plate can be referred to as both ionic current source, and as a flow shaping element, and can serve from a deposition-rate corrective prospective in either altering the flow of ionic current, in altering the convective flow of material, or both.

In certain embodiments, a wafer holder and associated positioning mechanism hold a rotating wafer very close to the upper surface of the AHRICS plate. In typical cases, the separation distance is about 1-10 millimeters, or about 2-8 millimeters. This small plate to wafer distance can create a plating pattern on the wafer associated with proximity "imaging" of individual holes of the pattern, particularly near the center of wafer rotation. To avoid this phenomenon, in some embodiments, the individual holes (particularly at and near the wafer center) can be constructed to have a particularly small size, for example less than about $\frac{1}{5}^{th}$ the plate to wafer gap. When coupled with wafer rotation, the small pore size allows for time averaging of the flow velocity of impinging fluid coming up as a jet from the plate and reduces or avoids small scale non-uniformities (e.g., those on the order of micrometers). Despite the above precaution, and depending on the properties of the plating bath used (e.g. particular metal deposited, conductivities, and bath additives employed), in some cases deposition may be prone to occur in a micro-non-uniform pattern as the time average exposure and proximity-imaging-pattern of varying thickness (for example, in the shape of a "bulls eye" around the wafer center) and corresponding to the individual hole pattern used. This can occur if the finite hole pattern creates an impinging flow pattern that is non-uniform and influences the deposition. In this case, introducing lateral flow across the wafer center has been found to largely eliminate any micro-non-uniformities otherwise found there.

In various embodiments, the AHRICS plate has a sufficiently low porosity and pore size to provide a viscous backpressure and high vertical impinging flow rates at normal operating volumetric flow rate. In some cases, about 0.1-10% of the channeled ionically resistive plate is open area allowing fluid to reach the wafer surface. In particular embodiments, about 1-5% of the plate is open area.

The porosity of the plate can be implemented in many different ways. In various embodiments, it is implemented with many vertical holes of small diameter. In some cases the plate does not consist of individual "drilled" holes, but is created by a sintered plate of continuously porous material. Examples of such sintered plates are described in U.S. Pat. No. 6,964,792, which is herein incorporated by reference in its entirety. In some embodiments, drilled non-communicating holes have a diameter of about 0.01 to 0.05 inches. In some cases, the holes have a diameter of about 0.02 to 0.03 inches. As mentioned above, in various embodiments the holes have a diameter that is at most about 0.2 times the closest gap distance between the AHRICS and the wafer substrate. The holes are generally circular in cross section, but need not be circular in all embodiments. Further, to ease construction, all holes in the plate may have the same diameter. However this need not be the case, and so both the individual size and local density of holes may vary over the plate surface as specific requirements may dictate.

As an example, an AHRICS can be a solid plate made of a suitable ceramic or plastic (generally a dielectric insulating and mechanically robust material), having a large number of small holes provided therein, e.g. at least about 1000 or at least about 3000 or at least about 5000 or at least about 6000. The porosity of the plate may be less than about 5 percent.

Generally, the distribution of holes over the AHRICS plate is of uniform density and non-random. In some cases, however, the density of holes may vary, particularly in the radial direction. In a specific embodiment there is a greater density and/or diameter of holes in the region of the AHRICS plate that directs flow toward the center of the rotating substrate. Further, in some embodiments, the holes directing electrolyte at or near the center of the rotating wafer may induce flow at a non-right angle with respect to the wafer surface. Further the holes in this region may have a random or partially random distribution non-uniform plating "rings" due to any interaction between the limited number of hole and the wafer rotation.

The AHRICS plate is significantly more resistive than the plating bath media, when in use. The high ionic resistance of the plate can be achieved by controlling the thickness and conductivity of the plate. Typical thickness of the plate in some embodiments is between about 0.25-1 inches. The low conductivity (or high resistivity) of the plate can be achieved by either selecting a material that has a low ionic conductivity, or by choosing an ionically insulating material and drilling holes through the material to introduce anisotropic ionic conductivity. In the latter case, the conductance of the final plate can be controlled by controlling the hole density and hole size. The final conductivity of the AHRICS plate may be between about 1% to about 20% of the conductivity of the plating solution media, although AHRICs with conductivities that are lower than about 1% of the conductivity of the plating solution may be used.

In the preferred embodiments, the AHRICS plate has predominantly an anisotropic conductance. In various embodiments, the plate will allow current flow substantially or only in the Z-direction, and little or no current is allowed to flow in the r-direction. In actual application, due to the finite size of the holes drilled through the plates, there will be some r-directed current flow inside the holes but the level of current is negligible as compared to current that flows in the Z-direction. The anisotropic conductance characteristic of the AHRICS plate establishes the desired electrical field distribution above the plate, which in turn drives the desired current density distribution on the cathode.

The shape of the AHRICS plate plays an important role in the functioning of the plate. The optimal plate shape depends on the application and on hardware components of the plating system. For a substantially flat current density profile at the wafer, a convex shaped plate, either parabolically-sloped (Shape A) or linearly-sloped (Shape D) plate gives good results, with Shape A generating globally flat current profiles. On the other hand, a center dished concave plate (Shape C) of the same resistance reduces the current density in the center region of cathode (wafer), while increasing the current density in the edge region. The dished plate of Shape C may be useful in applications where terminal effect is not a concern but a dished final plating thickness profile is desirable.

For a dome-shaped plate (Shapes A and D), as described above, the amount of doming required to achieve a flat profile depends on the total resistance of the AHRICS plate and on the application. In some embodiments, a typical total doming (z-direction position variation between plate edge and center on the plate surface, D4 is between about 4 mm and about 15 mm. It is expected that the more resistive the AHRICS plate is, the less doming is needed in order to maintain a flat current density profile when plating on a wafer substrate with very high sheet resistance. On the other hand, with a low resistance AHRICS plate, a flat current density profile could still be achieved with a much more domed AHRICS plate. In both cases, to achieve overall flat profile, the shapes of the plates' substrate-facing surface should preferably follow parabolic functions. In some applications, it may be desirable to provide a plate with the substrate-facing surface curvature following a combination of function (e.g., parabolic and/or linear) to tune the current density profile to desired shapes.

The AHRICS plate is disposed within a certain distance to the wafer—with the domed AHRICS plate in the plating system, the distance between the plate and the main cathode (wafer substrate) varies from center of the plating system to the edge. In the center, the typical distance is between about 2 mm to about 15 mm (referring to distance D1 in FIGS. 1A and 1D), while on the edge the typical distance is between about 6 mm to about 20 mm (referring to distance D2 in FIGS. 1A and 1D). The difference in the distances between cathode (wafer) and AHRICS plate from the center of the cathode to the edge strongly impacts the "correction" to the current density profile to drive flat current density profile. If the distance at the edge become too large (for example, >20 mm), too much current flows to the edge of the cathode, which requires additional compensation such as a secondary cathode in order to match the near edge current density to center, and the current efficiency (defined here as the total current plated on the wafer divided by total current provided by the anode) is reduced significantly. If the distance at the center becomes too small, center spike problem will manifest itself especially when the distance between holes on the AHRICS plate is too large. Center spikes are the regions of increased plating at the very center of the wafer cathode, which occur due to the imaging effect from central channels on the AHRICS plate. The local slope of the AHRICS plate substrate-facing surface impacts the degree of "correction" to the current density profile.

In some embodiments one or more ionically resistive ionically permeable plates may be stacked with an AHRICS. In some applications, an AHRICS plate with very high resistance may be required. For example, the degree of convex doming may have to be constrained to address edge effects or other challenges. As explained, using AHRICS plates with relatively less doming may require higher resistance in the plates. For such applications, if the plate is made of an insulating material with holes drilled through the plate to allow anisotropic ionic conductance, the distance between holes might be large in order to get the very low conductance. When the holes are spaced too far apart from each other, the center of the wafer might get too much plating as a result of localized jetting flow to the wafer. This problem is sometimes described as a "center spike". While increasing the thickness of the plate and/or reducing the hole size could be used to allow smaller distance between holes while maintaining the same overall conductance, there are limits on the size of the holes and on the thickness of the plate due to limitations on the capability of the drilling tool. To address this problem in certain application, multiple stacked plates of lower resistance that collectively provide an equivalent necessary total resistance, may be used. When stacked plates are used, the distance between holes may be reduced to mitigate the center spike problem. In the case of multiple plates stacked together, the constituent plates may need to be separated from one another. In certain embodiments, the distance between these plates is between about 0.1 to 5 mm.

In some embodiments the AHRICS is used in an electroplating apparatus with one or more additional components configured to mitigate terminal effect and/or dynamically change current density profile during plating. In some embodiments, the electroplating apparatus having an AHRICS further includes a secondary (thief) cathode configured to divert ionic current from the edge region of the wafer substrate. In some embodiments, the AHRICS can be used in combination with a shield positioned between the wafer substrate and the AHRICS and configured to block ionic current near the edge of the wafer substrate.

Examples of components that can be used in combination with the AHRICS include field shaping elements (such as those described in the U.S. Pat. No. 7,070,686, and in the US patent application publication No. 2003/0079995), dynamically variable field shaping elements (US patent application publication No. 2013/0137,242), auxiliary cathodes (such as described in the US patent application publication No. 2010/0116672), secondary cathodes (such as described in the U.S. Pat. No. 7,854,828 and in the U.S. Pat. No. 8,308,931), segmented anodes (described in the U.S. Pat. No. 6,497,801), and a flat high resistance ionic current source (U.S. Pat. No. 7,622,024). Each of these patents is incorporated herein by reference in its entirety for the purpose of providing description of these additional components.

Apparatus

Embodiments disclosed herein concern a plating apparatus employing specially shaped AHRICS to compensate the terminal effect and to modulate the current density profiles. It has been demonstrated that electroplating systems with appropriately shaped AHRICS plates (1) reduce the electrical path resistance differentiation between center and edge of the wafer substrate; (2) create a "correction" to the current density distribution by re-distributing currents inside a plating apparatus, thus further compensating for the terminal effect and leading to very uniform plating on center of the wafer substrate; (3) when combined with a secondary cathode, which tunes the current density profile near the wafer substrate edge during plating, lead to very uniform global plating on the wafer substrate; and (4) cover a range of wafer substrates with a wide range of sheet resistances (from ~50 ohm/sq to 0.01 ohm/sq, for example), without the need for tuning as material is plated on the substrate or as the initial seed layer thickness changes. A single AHRICS plate will be suitable for plating on a variety of wafer substrates with seed layers of different sheet resistances. No major change in plating conditions is needed during the whole plating process, although the sheet resistance of the wafer substrate changes dramatically during the plating process. In addition, it was demonstrated that the current density profile can be adjusted for needs of particular applications by varying the shape and/or the conductance of the plate.

The disclosed embodiments provide a simple solution to current density control in a plating system. A single hardware configuration will be able to cover a very wide range of seed layers with different sheet resistances. With this concept, the number of components in a plating cell can be reduced significantly. Process tuning needed is also significantly reduced since the AHRICS plate itself provides "self-correction" for different seeds.

Electroplating apparatus employing the disclosed AHRICS plate may employ a relatively less complex power supply, reduce the number of hardware parts in the plating cell, and require less tuning during operation. Such apparatus may also considerably reduce the plating cell footprint. It is understood that the embodiments provided herein are not limited by these advantageous features, and in some embodiments combinations of the AHRICS with other components configured for dynamic current control and/or for terminal effect mitigation can be used.

In one aspect an electroplating apparatus is provided. The electroplating apparatus includes: (a) a plating chamber configured to contain an electrolyte and an anode while electroplating metal onto a substantially planar substrate (e.g., onto a semiconductor wafer); (b) a substrate holder configured to hold the substantially planar substrate such that a plating face of the substrate is separated from the anode during electroplating; and (c) an anisotropic high resistance ionic current source (AHRICS), e.g., a high resistance anisotropic plate, having an edge region and a central region and comprising a substrate-facing surface having a shape that provides a greater distance to the substrate from the edge region than from the central region during electroplating. In this embodiment the AHRICS is positioned and configured preferably to correct ionic current such that the edge and center of the substrate receive substantially the same amount of plating.

Figure 2:
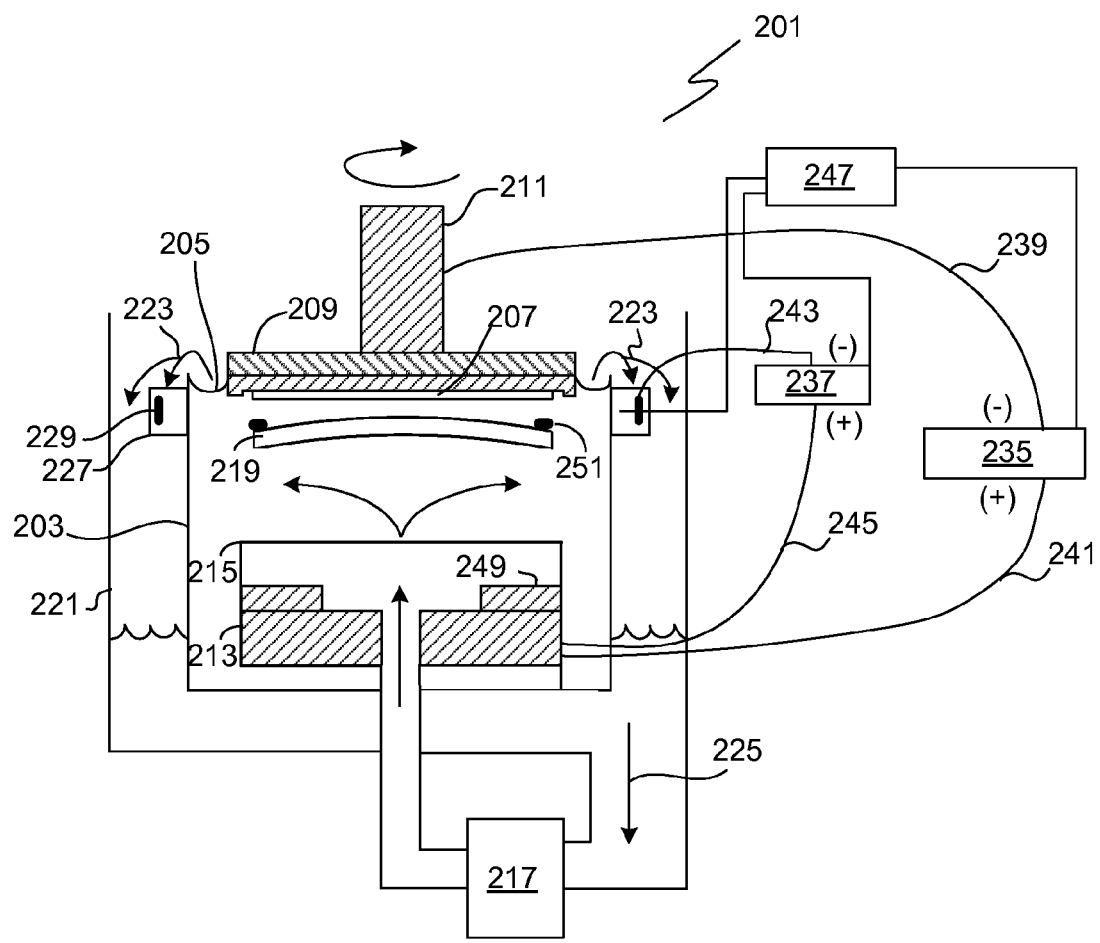
FIG. 2 is a schematic cross-sectional view of an electroplating module containing an AHRICS in accordance with an embodiment provided herein.

A specific embodiment of an electroplating module employing a convex AHRICS is schematically and cross-sectionally illustrated in FIG. 2. The illustrated electroplating module 201 includes an electroplating cell 203 that contains the electroplating solution, which is shown at a level 205. A wafer 207 may be immersed in the electroplating solution while held by a "clamshell" holding fixture 209, the clamshell mounted on a rotatable spindle 211. The rotatable spindle allows for rotation of clamshell 209 together with the wafer 207. Clamshell-type electroplating apparatus are further described U.S. Pat. No. 6,156,167 and U.S. Pat. No. 6,800,187, both of which are hereby incorporated by reference. Of course, wafer holders other than clamshell-type fixtures may alternatively be employed.

An anode 213 is disposed below the wafer 207 within the electroplating cell 203 and is separated from the wafer region by an anode membrane 215, which is an ion selective membrane in some implementations. The region below the anode membrane is often referred to as an "anodic region" or as an "anode chamber" and electrolyte within this chamber as "anolyte," while the region above the anode membrane is often referred to as a "cathodic region" or as a "cathode chamber" and the electrolyte within this chamber as "catholyte." The anode membrane 215 allows ionic communication between the anodic and cathodic regions of the electroplating cell, while preventing any particles generated at the anode from entering the proximity of the wafer and contaminating it. The anode membrane may also be useful in redistributing current flow during the electroplating processes and thereby improve electroplating uniformity. Anode membranes are further described in U.S. Pat. No. 6,126,798 and U.S. Pat. No. 6,569,299, both of which are hereby incorporated by reference.

The electroplating solution may be continuously provided to electroplating cell 203 by a pump 217. Generally, the electroplating solution flows upwards through an anode membrane 215 and through the convex AHRICS 219 to the center of wafer 207 and then radially outward and across the wafer. In some implementations, the electroplating solution may be provided into the anodic region of the electroplating cell 203 from the side of the electroplating cell. In some implementations, the electroplating solution may be supplied through separate inlets into anodic and cathodic regions of the electroplating cell 203.

As explained above, the AHRICS 219 is located in close proximity of the wafer (e.g., within about 10 millimeters or between about 3 to 8 millimeters, in various embodiments) and serves as a constant ionic current source to the wafer. That is, the AHRICS 219 shapes the electrolyte current near the wafer to provide a relatively uniform current distribution over the wafer surface. As explained, the element may contain a plurality of one-dimensional through holes, as described further below.

After the electroplating solution flows across the surface of the wafer, some of the solution may overflow the electroplating cell 203 to an overflow reservoir 221, as indicated by arrows 223. The electroplating solution may be filtered (not shown) and returned to pump 217, as indicated by arrow 225, completing the recirculation of the electroplating solution.

In some embodiments, such as that shown in FIG. 2, an electroplating module may employ a second cathode chamber 227 containing a second cathode 229 (i.e., a thief cathode) which may be located on the outside of the electroplating cell 203 and peripheral to the wafer 207. Generally, the second cathode 229 may be positioned at a number of locations within the electroplating cell or outside the electroplating cell.

In some embodiments, the electroplating solution overflows a weir wall of the electroplating cell 203 into the second cathode chamber 227. In some embodiments, the second cathode chamber 227 is separated from the electroplating cell 203 by a wall having multiple openings covered by an ion-permeable membrane. The membrane allows ionic communication between the electroplating cell 203 and the second cathode chamber 227, thereby allowing current to be diverted to the second cathode. The porosity of the membrane may be such that it does not allow particulate material to cross from the second cathode chamber 227 to the electroplating cell 203 and result in wafer contamination. The openings in the walls may take the form of rounded holes, slots, or other shapes of various sizes. In one implementation, the openings are slots having dimensions of, e.g., about 12 millimeters by 90 millimeters. Other mechanisms for allowing fluidic and/or ionic communication between the second cathode chamber 227 and the electroplating cell 203 are possible. Examples include designs in which the membrane, rather than an impermeable wall, provides most of the barrier between the electroplating solution in the second cathode chamber 227 and the electroplating solution in the electroplating cell 203. A rigid framework may provide support for the membrane in such implementations.

Two DC power supplies 235 and 237 can be used to control current flow to the wafer 207 and to the second cathode 229, respectively. A power supply 235 has a negative output lead 239 electrically connected to the wafer 207 through one or more slip rings, brushes, or contacts (not shown). The positive output lead 241 of the power supply 235 is electrically connected to the anode 213 located in electroplating cell 203. The power supply may have an output voltage of up to about 250 volts, for example. Similarly, a power supply 237 has a negative output lead 243 electrically connected to the second cathode 229, and a positive output lead 245 electrically connected to the anode 213. Alternatively, one power supply with multiple independently controllable electrical outlets can be used to provide different levels of current to the wafer and to the second cathode.

The power supplies 235 and 237 may be connected to a controller 247, which allows modulation of current and potential provided to the elements of the electroplating module 201. For example, the controller may allow electroplating either in current-controlled or potential-controlled regimes. The controller 247 may include program instructions specifying current and voltage levels that need to be applied to various elements of the electroplating module, as well as times at which these levels need to be changed. For example, it may include program instructions for transitioning from potential-control to current-control upon immersion of the wafer into the electroplating solution.

During use, the power supplies 235 and 237 bias both the wafer 207 and the second cathode 229 to have a negative potential relative to the anode 213. This causes an electrical current flowing from anode 213 to the wafer 207 to be partially or substantially diverted to the second cathode 229. The electrical circuit described above may also include one or several diodes that will prevent reversal of the current flow, when such reversal is not desired. An undesired current feedback may occur during electroplating processes, since the anode 213, which is set at ground potential, is the common element of both the wafer circuit and the second cathode circuit.

The level of current applied to the second cathode 229 may be set to lower values than the level of current applied to the wafer 207, with the second cathode current being presented as a percentage of the wafer current. For example, a 10% second cathode current corresponds to a current flow at the second cathode that is 10% of the current flow to the wafer. The direction of the current as used herein is the direction of net positive ion flux. During electroplating, the electrochemical reduction of whatever metal is being plated (e.g., $Cu^{2+}+2e^-\rightarrow Cu$) occurs both on the wafer surface and on the second cathode surface, which results in the deposition of the metal on the surfaces of both the wafer and the second cathode. Since the current is diverted from the wafer to the second cathode, the thickness of deposited metal layer at the edge of the wafer may be diminished. This effect typically occurs in the outer 20 millimeters of the wafer, and is especially pronounced in its outer 10 millimeters, particularly when electroplating is performed on a liner layer or a thin seed layer. The use of the second cathode 229 can substantially reduce center-to-edge non-uniformity which typically results from terminal and field effects. A second cathode may be used either alone or in combination with further auxiliary cathodes or with a variety of fixed or dynamic shields. It should be understood that the secondary/auxiliary cathode and its associated power supply/supplies as well as any other associated hardware elements are optional features of an electroplating module.

Other optional features of an electroplating module are one or more shields, such as shield 249, which can be positioned within the electroplating cell 203 between the AHRICS 219 and the anode 213 (e.g., below the resistive element in wafer-facing-down systems). The shields are usually ring-shaped dielectric inserts, which are used for shaping the current profile and improving the uniformity of electroplating, such as those described in U.S. Pat. No. 6,027,631, which is hereby incorporated by reference. However, other shield designs and shapes may be employed as are known to those of skill in the art, such as shields taking the shape of wedges, bars, circles, ellipses, and other geometric designs. Ring-shaped inserts may also have patterns at their inside diameter, which may improve the ability of the shield to shape the current flux in the desired fashion. The function of the shields may differ, depending on their position in the electroplating cell 203. An electroplating module may include a variety of static shields, as well as a variety of variable field shaping elements, such as those described in U.S. Pat. No. 6,402,923 and U.S. Pat. No. 7,070,686, both of which are hereby incorporated by reference. An electroplating module may also include a variety of segmented anodes such as those described in U.S. Pat. No. 6,497,801, or concentric anodes such as those described in U.S. Pat. Nos. 6,755,954 and 6,773,571, all of which are hereby incorporated by reference. While shielding inserts may be useful for improving electroplating uniformity, they are optional, and alternative shielding configurations may also be employed.

An optional shield may also be positioned within the electroplating cell 203 between the AHRICS 219 and the wafer 207, such as shield 251 in FIG. 2. In some implementations, a shield may reside about the perimeter of the AHRICS to further improve edge-center plating uniformity. In some implementations, a shield may reside directly on the resistive element. In some implementations, a shield may be positioned between the resistive element and the wafer to block a path between at least some of the perforations at a peripheral region of the element and the wafer.

Figure 3:
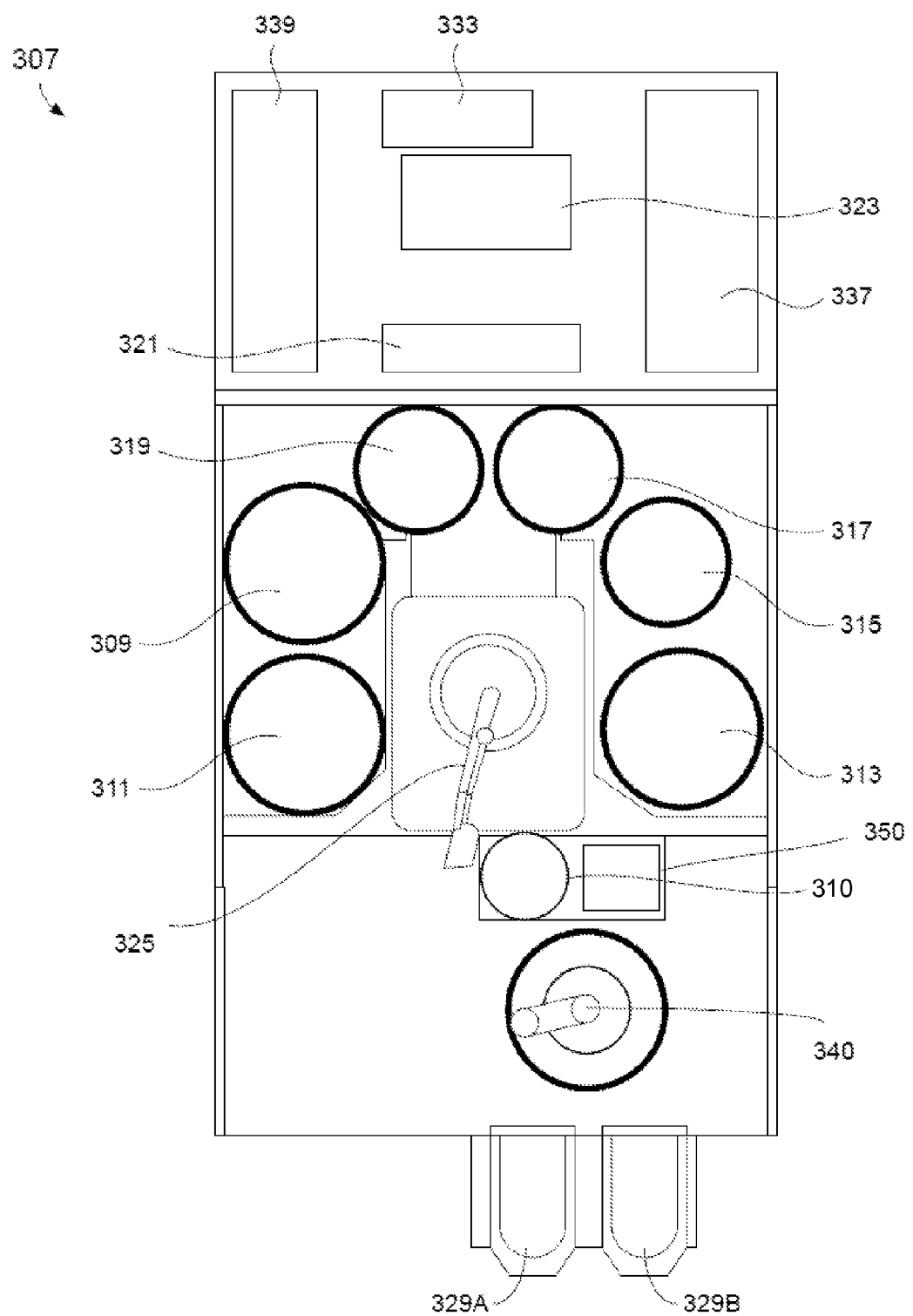
FIG. 3 is a schematic view of an integrated electroplating system in accordance with an embodiment presented herein.

FIG. 3 presents a schematic of one exemplary integrated electroplating system which may be used to carry out multiple operations. As shown in FIG. 3, an electroplating system 307 may include multiple electroplating modules, in this case the three separate modules 309, 311, and 313, where each of these modules can be a module described in FIG. 2. As described more fully below, each electroplating module typically includes a cell for containing an anode and an electroplating solution during electroplating, and a wafer holder for holding the wafer in the electroplating solution and rotating the wafer during electroplating. The electroplating system 307 shown in FIG. 3 further includes a post-electrofill processing system which includes three separate post-electrofill modules (PEMs) 315, 317 and 319. Depending on the embodiment, each of these may be employed to perform any of the following functions: edge bevel removal (EBR), backside etching, and acid cleaning of wafers after they have been electrofilled by one of modules 309, 311, and 313. Electroplating system 307 may also include a chemical dilution module 321 and a central electrofill bath 323. The latter may be a tank that holds the chemical solution used as the electroplating bath in the electrofill modules. Electroplating system 307 may also include a dosing system 333 that stores and delivers chemical additives for the plating bath. If present, the chemical dilution module 321 may store and mix chemicals to be used as the etchant in the post electrofill modules. In some embodiments, a filtration and pumping unit 337 filters the plating solution for central bath 323 and pumps it to the electrofill modules.

Finally, in some embodiments, an electronics unit 339 may serve as a system controller providing the electronic and interface controls required to operate electroplating system 307. The system controller typically includes one or more memory devices and one or more processors configured to execute instructions so that the electroplating system can perform its intended process operations. Machine-readable media containing instructions for controlling process operations in accordance with the implementations described herein may be coupled to the system controller. Unit 339 may also provide a power supply for the system.

In operation, a robot including a back-end robot arm 325 may be used to select wafers from a wafer cassette, such as a cassette 329A or 329B. Back-end robot arm 325 may attach to the wafer using a vacuum attachment or some other feasible attaching mechanism.

A front-end robot arm 340 may select a wafer from a wafer cassette such as the cassette 329A or the cassette 329B. The cassettes 329A or 329B may be front opening unified pods (FOUPs). A FOUP is an enclosure designed to hold wafers securely and safely in a controlled environment and to allow the wafers to be removed for processing or measurement by tools equipped with appropriate load ports and robotic handling systems. The front-end robot arm 340 may hold the wafer using a vacuum attachment or some other attaching mechanism. The front-end robot arm 340 may interface with the cassettes 329A or 329B, a transfer station 350, or an aligner 310. From the transfer station 350, a back-end robot arm 325 may gain access to the wafer. The transfer station 350 may be a slot or a position to and from which front-end robot arm 340 and back-end robot arm 325 may pass wafers without going through the aligner 310. Note, that in some embodiments, the transfer station 350 may serve as (or serve as the location of) a wafer edge imaging module. In some implementations, however, to ensure that a wafer is properly aligned on the back-end-robot 325 for precision delivery to an electroplating module, the back-end robot arm 325 may align the wafer with aligner 310. Back-end robot arm 325 may also deliver a wafer to one of the electrofill modules 309, 311, or 313 or to one of the three post-electrofill modules 315, 317, and 319.

To ensure that the wafer is properly aligned on back-end robot arm 325 for precision delivery to an either an electroplating module 309, 311, or 313, or an EBR module 315, 317, and 319 (assuming these PEMs perform EBR), back-end robot arm 325 transports the wafer to an aligner module 310. In certain embodiments, aligner module 310 includes alignment arms against which back-end robot arm 325 pushes the wafer. When the wafer is properly aligned against the alignment arms, the back-end robot arm 325 moves to a preset position with respect to the alignment arms. In other embodiments, the aligner module 310 determines the wafer center so that the back-end robot arm 325 picks up the wafer from the new position. It then reattaches to the wafer and delivers it to one of the electroplating modules 309, 311, or 313, or EBR modules 315, 317, and 319.

Thus, in a typical operation of forming a layer of metal on a wafer using the electroplating system 307, back-end robot arm 325 transports a wafer from wafer cassette 329A or 329B to aligner module 310 for pre-electroplating centering adjustment, then to electroplating module 309, 311, or 313 for electroplating, then back to aligner module 331 for pre-EBR centering adjustment, and then to EBR module 315, 317, or 319 for edge bevel removal. Of course, in some embodiments, a centering/alignment step may be omitted.

As described more fully below, the electroplating operation may involve loading the wafer in a clamshell type wafer holder and lowering the clamshell into an electroplating bath contained within a cell of one of electroplating modules 309, 311, or 313 where the electroplating is to take place. The cell oftentimes contains an anode which serves as a source of the metal to be plated (although the anode may be remote), as well as an electroplating bath solution oftentimes supplied by a central electrofill bath reservoir 323 along with optional chemical additives from a dosing system 333. After the optional EBR, the wafer is typically cleaned, rinsed, and dried.

Finally, it is noted that after post-electrofill processing is complete, back-end robot arm 325 may retrieve the wafer and return it to cassette 329A or 329B. From there the cassettes 329A or 329B may be provided to other semiconductor wafer processing systems such as a chemical mechanical polishing system, for example.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Method

In one aspect, a method of electroplating on a substrate is provided. The method includes: (a) providing the substrate to a plating chamber configured to contain an electrolyte and an anode while electroplating metal onto the substrate, wherein the plating chamber includes: (i) a substrate holder holding the substrate such that a plating face of the substrate is separated from the anode during electroplating, and (ii) an AHRICS having an edge region and a central region and comprising a substrate-facing surface having a shape that provides a greater distance to the substrate from the edge region than from the central region during electroplating; and (b) electroplating a metal onto the substrate plating face while rotating the substrate and while providing the electrolyte in the electroplating cell in the direction of the substrate plating face through the channels of the flow shaping element. The method typically involves immersing the substrate's plating face into electrolyte, rotating the wafer substrate during electroplating, while the plating face of the wafer substrate is immersed into an electrolyte, and negatively biasing the wafer substrate via the electrical contacts contacting the seed layer at the edge of the wafer substrate. In some embodiments, power is provided to a secondary cathode to divert a portion of ionic current from the edge of the wafer substrate during electroplating.

Computational and Experimental Studies of AHRICSs

Several AHRICS plates with different shapes (Shapes A, C, and D as illustrated in FIG. 1A, FIG. 1C, and FIG. 1D) and the flat plate having Shape B shown in FIG. 1B were computationally tested and the impact of the plate shape on current density distributions on cathodes (wafers) was evaluated. The computational modeling was performed for seed layers having 50 ohm/sq and 5 ohm/sq sheet resistances. For comparison, each of the tested plates (A, B, C, and D) had the same vertical thickness and total ionic resistance. The AHRICS plate having shape A was 9.43 mm thick, with an 8 mm convex parabolic dome shape and 1.25% porosity. Doming is measured as the z-direction difference between the center of the dome and the edge of the dome (D4, in FIG. 1A). All the plates had anisotropic conductance (conducting in the z-direction substantially normal to the plating face of the substrate but not conducting in the r-direction, parallel to the plating face of the substrate).

Figure 4A:
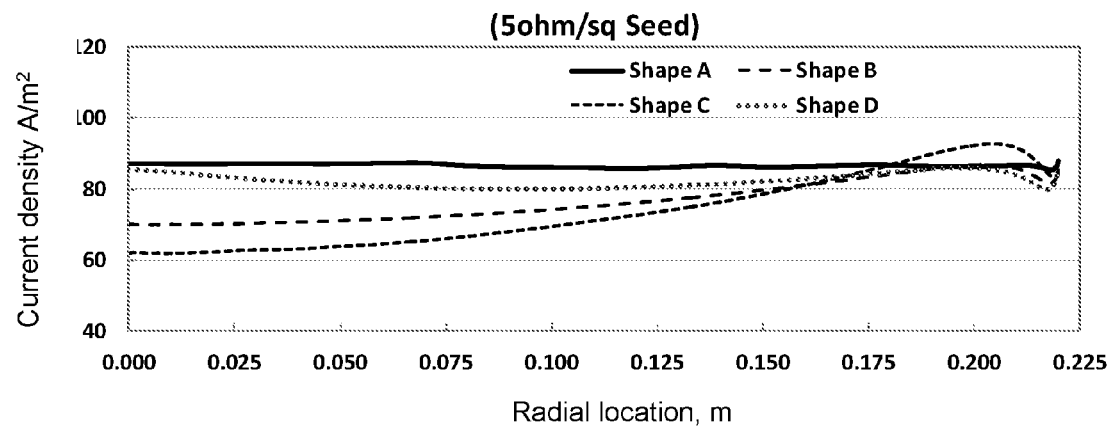
FIG. 4A is a computational modeling plot for a 450 mm cathode (wafer), illustrating radial current density profiles for plating with different shapes of AHRICS plates on a seed layer having a sheet resistance of 5 Ohm/square.

FIG. 4A illustrates computational modeling of current density distribution for electroplating with plates having shapes A, B, C, and D on a substrate having a seed layer with 5 Ohm/square sheet resistance. As illustrated, convex domed or pointed AHRICS plate (Shape A and Shape D respectively) can significantly reduce the overall current density variation on the main cathode (wafer) surface in the center region of the main cathode. A convex shape is thus more suitable for applications that require uniform plating profiles. Based on the modeling results, a parabolic domed AHRICS plate (shape A) further reduces current density variation as compared to a pointed (linear) convex plate (shape D).

Figure 4B:
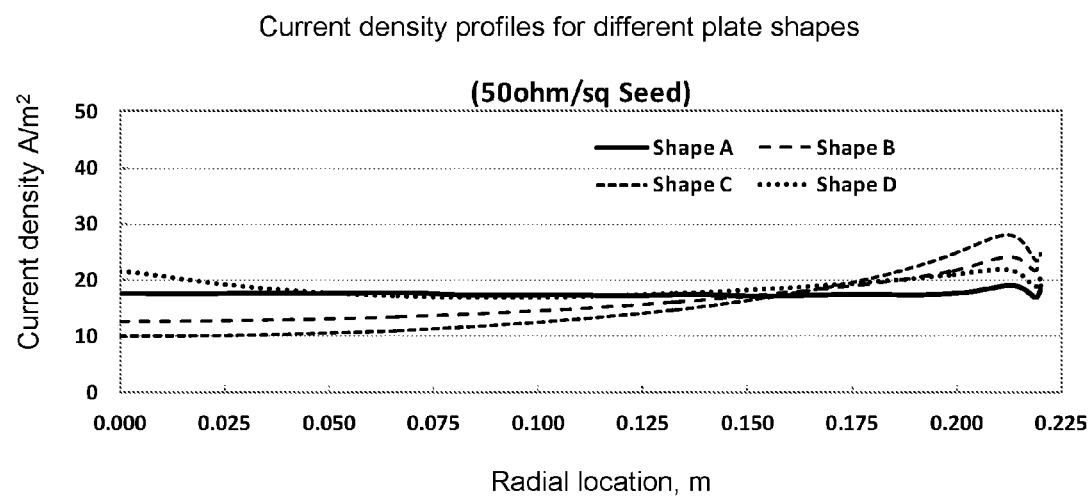
FIG. 4B is a computational modeling plot for a 450 mm cathode (wafer), illustrating radial current density profiles for plating with different shapes of AHRICS plates on a seed layer having a sheet resistance of 50 Ohm/square.

FIG. 4B illustrates computational modeling of current density distribution for electroplating with plates having shapes A, B, C, and D on a substrate having a seed layer with 50 Ohm/square sheet resistance. The results are similar to the results shown in FIG. 4A. Convex shapes of AHRICS (shapes A and D) provide significantly more uniform center-to-edge current density than the flat plate of Shape B, or the concave Shape C, which promotes increased current density at the edge as compared to the center.

When combined with a secondary cathode, global uniform current density distribution on the wafer can be achieved with plate of shape A. An electroplating system having a secondary cathode is depicted in FIG. 2.

It has been demonstrated that similar current density profiles can be achieved using either a higher resistance AHRICS plate with relatively little doming, or an AHRICS plate with relatively lower resistance and more doming. In other words, similar current density profiles on the wafer substrate can be achieved by either a very high resistance AHRICS plate with little or no doming, or with a much less resistive AHRICS plate with significant doming. The former will call for much higher plating voltage during a plating process in order to deliver the same current to the anode. This may require a larger power supply, etc. Thus the "doming" itself provides an effective way to reduce the need for a very high resistance AHRICS plate.

Figure 5A:
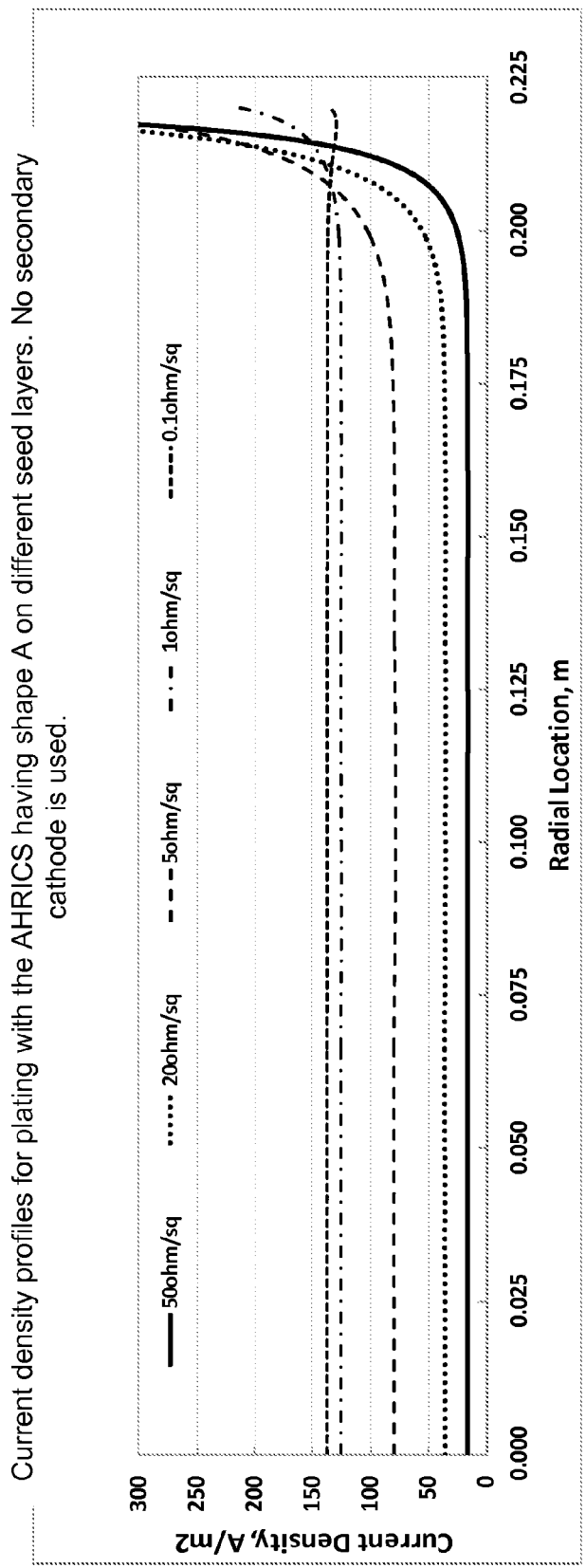
FIG. 5A is a computational modeling plot for a 450 mm cathode (wafer), illustrating radial current density profiles for plating with Shape A AHRICS plate on seed layers having different resistivities in an absence of a thief cathode.
Figure 5B:
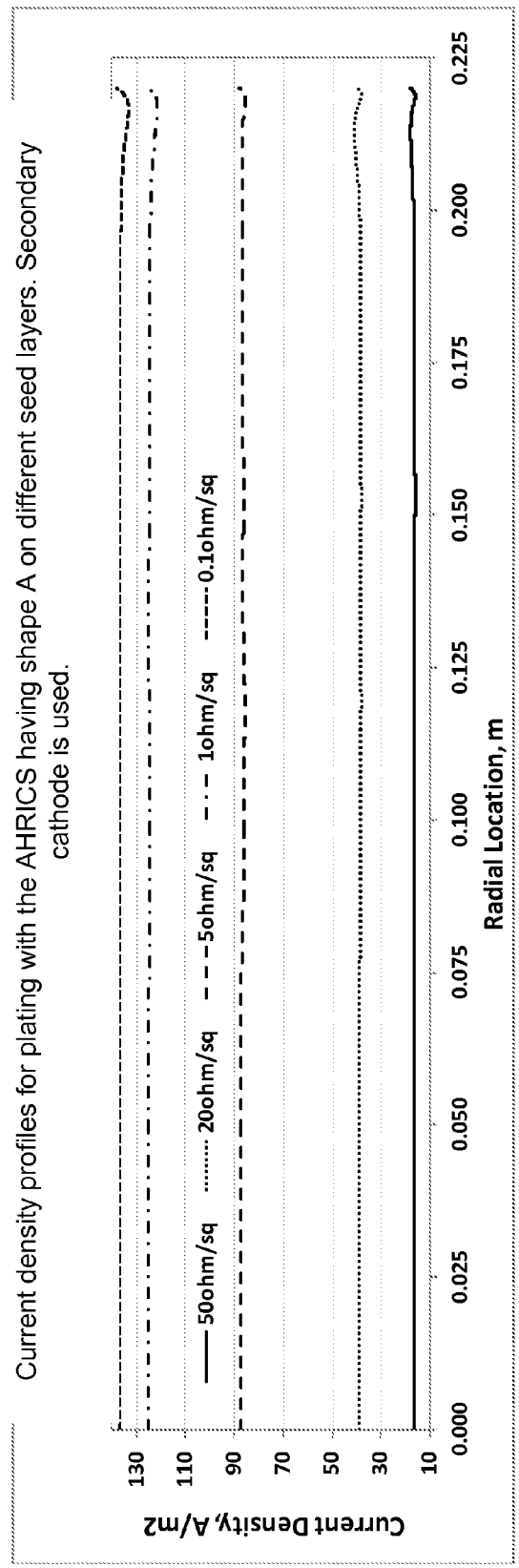
FIG. 5B is a computational modeling plot for a 450 mm cathode (wafer), illustrating radial current density profiles for plating with Shape A AHRICS plate on seed layers having different resistivities in the presence of a thief cathode.

FIG. 5A is an illustration of a computationally derived current density distribution with a dome-shaped AHRICS plate of Shape A on cathodes (wafer substrates) with different seed layers. In all cases, the AHRICS plate was 9.43 mm thick, with an 8 mm convex parabolic dome shape and 1.25% porosity. As shown, a uniform current density distribution was achieved on multiple wafers of different sheet resistances, ranging from 0.1 ohm/sq to 50 ohm/sq in the center region (from r=0 to r=190 mm for a 450 mm wafer substrate). The data is provided for the case in which a secondary cathode was not used. It can be seen that for the most resistive layers the near edge profiles were not optimal. FIG. 5B illustrates a similar computationally derived current density profile with the use of the secondary cathode (other parameters remained the same). It can be seen that a globally uniform current density distribution was obtained for a wide range of seed layer sheet resistances. Computational modeling presented in FIGS. 4A-4B and 5A-5B was performed for wafers having 450 mm diameter.

Figure 6A:
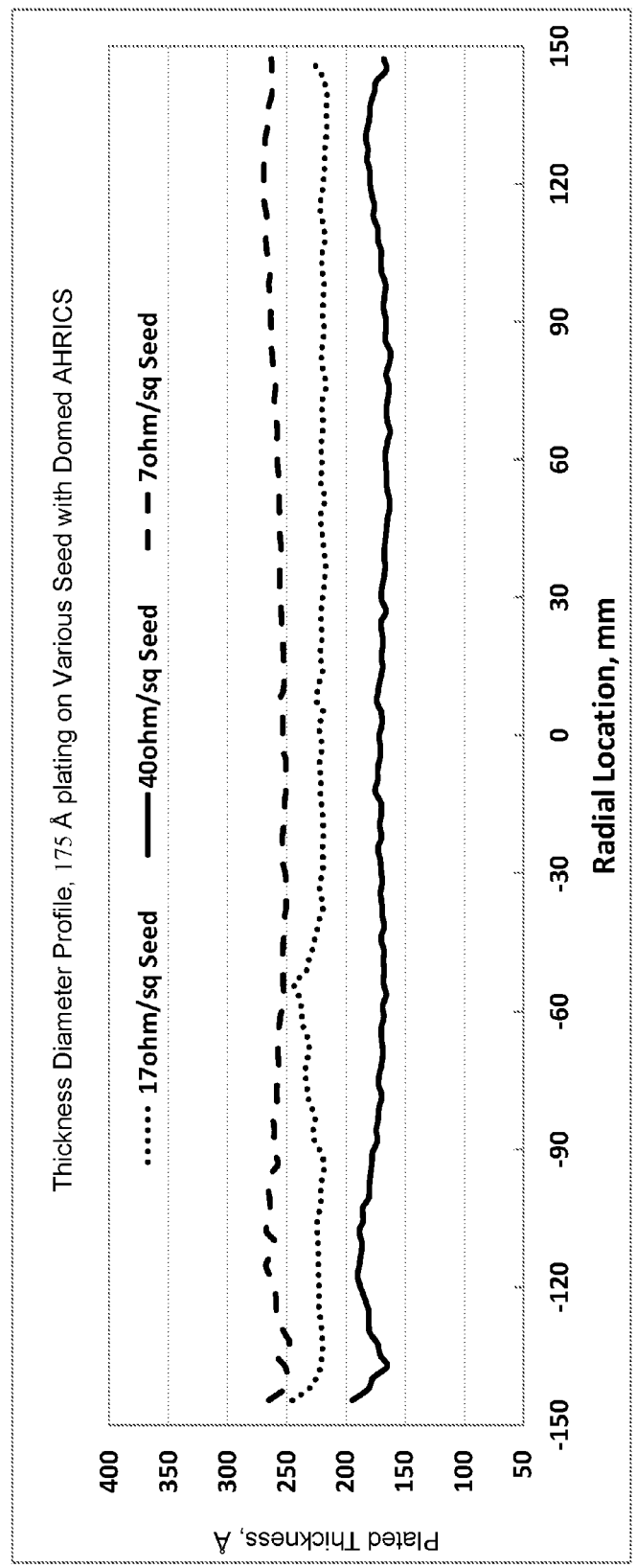
FIG. 6A is an experimental plot for a 300 mm cathode (wafer) illustrating radial thickness profile for electroplating with Shape A AHRICS plate on seed layers having different sheet resistances.
Figure 6B:
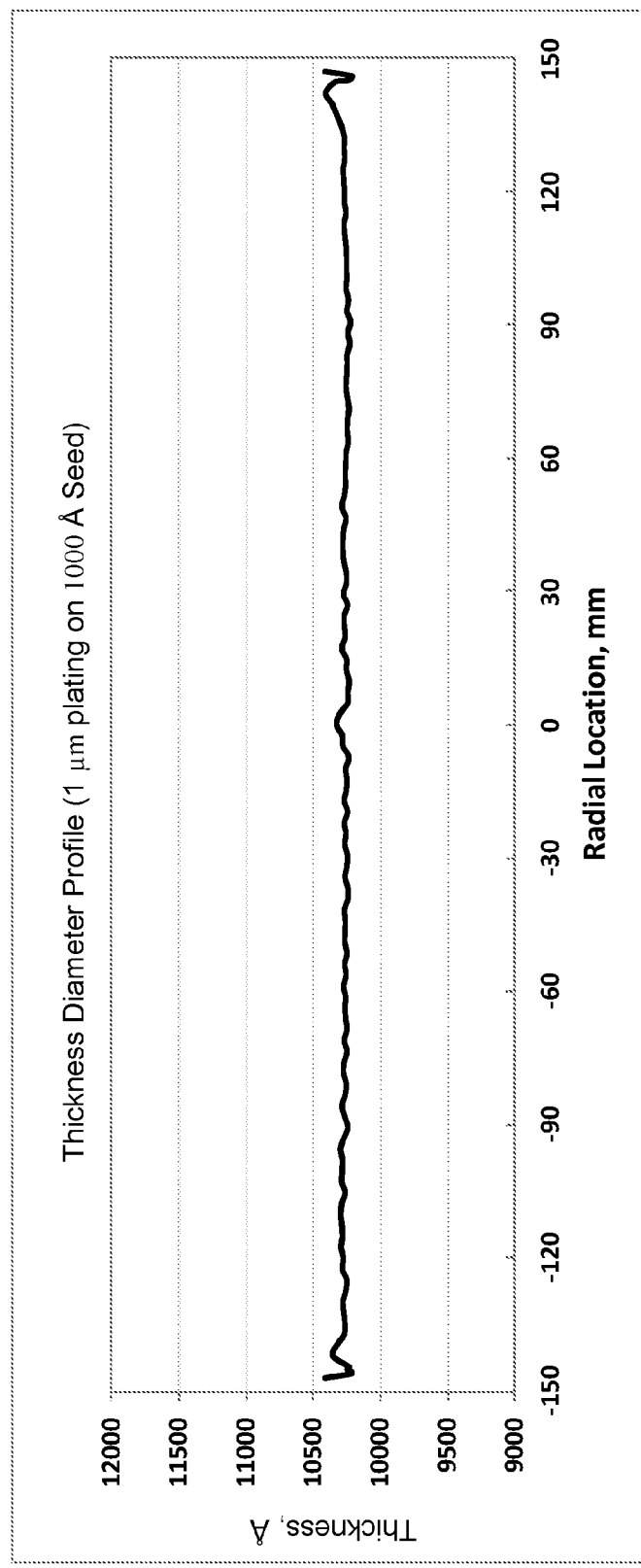
FIG. 6B is an experimental plot for a 300 mm cathode (wafer) illustrating thickness profile over the wafer diameter for electroplating 1 micron of copper on a 1000 Å thick seed layer using an electroplating apparatus with a Shape A AHRICS plate.

FIGS. 6A and 6B show the experimental data collected on an apparatus having a dome-shaped AHRICS plate of Shape A, using 300 mm diameter wafers as substrates. The 300 mm wafers was used to confirm the concept, because 300 mm wafers are readily available and inexpensive and deposition follows the same mechanism as on the 450 mm wafer substrates. The goal for this test is to achieve flat overall current density profile that translates to a flat plated film thickness profile on the cathode substrate (wafer of 300 mm diameter in this case). A parabolically domed plate was used. The used plate had 4.7% porosity, and had a total doming of about 10 mm (convex shape, center is about 10 mm closer to the wafer substrate than the edge of the plate). Data showed flat profiles on wafer substrates that had 40 ohm/sq seed layer, 17 ohm/sq seed layer, 7 ohm/sq seed layer, and 1000 A (0.2 ohm/sq) seed layer respectively. These data validated the computational modeling results provided above.

Figure 7:
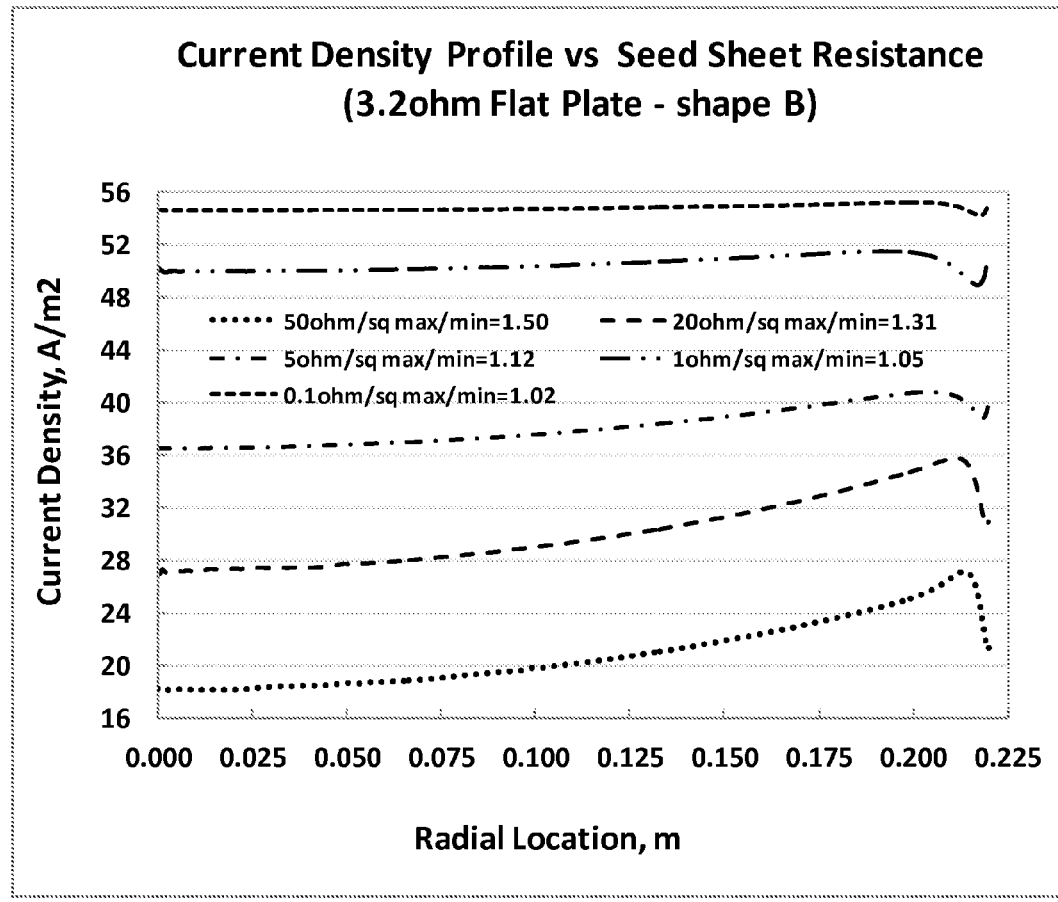
FIG. 7 is a computational modeling plot for a 450 mm cathode (wafer), illustrating radial current density profiles for plating with Shape B flat plate (comparative example) on seed layers having different sheet resistances.

For comparison, FIG. 7 is provided which shows results of computational modeling for current density distribution in an apparatus having a flat plate (shape B in FIG. 1B) on cathodes (wafer substrate) with different seed layers. Modeling was performed for a wafer having 450 mm diameter. The flat plate was 9.43 mm thick, with 1.25% porosity. In this case, the center current density profile changed significantly from a flat profile on a substrate with 0.1 ohm/sq seed layer with current density max/min ratio of about 1.02, to a dishing profile on a substrate with 50 ohm/sq seed layer with current density max/min ratio of about 1.5. It is clear that the dome-shaped AHRICS plate of Shape A discussed above showed an extra "tuning" or "correction" capability that the flat plate does not possess.

The invention claimed is:

1. An electroplating apparatus comprising:
   (a) a plating chamber configured to contain an electrolyte and an anode while electroplating metal onto a substantially planar substrate;
   (b) a substrate holder configured to hold the substantially planar substrate such that a plating face of the substrate is separated from the anode during electroplating; and
   (c) an anisotropic high resistance ionic current source (AHRICS) having an edge region and a central region and comprising a substrate-facing surface having a shape that provides a greater distance to the substrate from the edge region than from the central region during electroplating, wherein the AHRICS is positioned such that the plating face of the substrate is within 10 mm of the closest AHRICS surface during electroplating.

2. The apparatus of claim 1, wherein the AHRICS comprises an ionically resistive material with a plurality of channels made through said material, wherein said channels allow for transport of the electrolyte through the AHRICS.

3. The apparatus of claim 2, wherein the channels are not fluidically connected within the body of the AHRICS.

4. The apparatus of claim 1, wherein the thickness of the AHRICS is substantially the same in the central region and in the edge region.

5. The apparatus of claim 1, wherein the substrate-facing surface of the AHRICS follows a parabolic function from the edge region to the central region, when viewed in cross-section.

6. The apparatus of claim 1, wherein the substrate-facing surface of the AHRICS follows a linear function from the edge region to the central region, when viewed in cross-section.

7. The apparatus of claim 1, wherein the substrate-facing surface of the AHRICS follows both a linear function and parabolic function at different portions of the substrate-facing surface from the edge region to the central region, when viewed in cross-section.

8. The apparatus of claim 1, wherein the distance in z-direction between the center of the substrate-facing surface of the AHRICS and the edge of the substrate-facing surface of the AHRICS is between about 4 and 15 mm.

9. The apparatus of claim 1, wherein the AHRICS is positioned such that the distance between the substrate and the substrate-facing surface of the AHRICS is between about 6-20 mm in the edge region.

10. The apparatus of claim 1, wherein the substrate-facing surface of the AHRICS follows a polynomial function from the edge region to the central region, when viewed in cross-section.

11. The apparatus of claim 1, wherein the AHRICS is made of an ionically resistive material, and comprises between about 1,000-25,000 non-communicating channels made within the ionically resistive material.

12. The apparatus of claim 1, wherein the AHRICS is made of an ionically resistive material comprising a plurality of channels, wherein the diameter of each channel is not greater than the closest distance between the substrate and the AHRICS.

13. The apparatus of claim 1, further comprising one or more ionically resistive ionically permeable plates stacked with the AHRICS.

14. The apparatus of claim 1, further comprising one or more ionically resistive ionically permeable plates stacked with the AHRICS, wherein the plates are separated from one another.

15. The apparatus of claim 1, further comprising a secondary cathode configured to divert ionic current from an edge region of the substrate.

16. The apparatus of claim 1, further comprising a shield configured to block ionic current at the edge region of the substrate.

17. The apparatus of claim 1, wherein the AHRICS is configured to be stationary during electroplating.

18. A method of electroplating on a substrate, the method comprising:
   (a) providing the substrate to a plating chamber configured to contain an electrolyte and an anode while electroplating metal onto the substrate, wherein the plating chamber comprises:
      (i) a substrate holder holding the substrate such that a plating face of the substrate is separated from the anode during electroplating, and
      (ii) an anisotropic high resistance ionic current source (AHRICS) having an edge region and a central region and comprising a substrate-facing surface having a shape that provides a greater distance to the substrate from the edge region than from the central region during electroplating, wherein the AHRICS is positioned such that the plating face of the substrate is within 10 mm of the closest AHRICS surface during electroplating; and
   (b) electroplating a metal onto the plating face of the substrate while rotating the substrate and while providing the electrolyte in the plating chamber in the direction of the plating face of the substrate through channels of the AHRICS.

* * * * *